(12) United States Patent
Fujikata et al.

(10) Patent No.: US 6,570,744 B1
(45) Date of Patent: May 27, 2003

(54) MAGNETORESISTANCE EFFECT FILM AND DEVICE

(75) Inventors: Junichi Fujikata, Tokyo (JP); Masafumi Nakada, Tokyo (JP)

(73) Assignee: TDK Corporation (JP)

( * ) Notice: Subject to any disclaimer, the term of this patent is extended or adjusted under 35 U.S.C. 154(b) by 0 days.

(21) Appl. No.: 09/586,560

(22) Filed: May 25, 2000

(30) Foreign Application Priority Data

May 26, 1999 (JP) .......................................... 11/146810

(51) Int. Cl.⁷ ................................................. G11B 5/39
(52) U.S. Cl. ................................................. 360/324.11
(58) Field of Search ........................ 360/324.1, 324.11, 360/324.12, 324.2

(56) References Cited

U.S. PATENT DOCUMENTS

| | | | | |
|---|---|---|---|---|
| 5,701,223 A | * | 12/1997 | Fontana et al. | 360/324.11 |
| 5,766,743 A | * | 6/1998 | Fujikata et al. | 324/252 |
| 5,958,611 A | * | 9/1999 | Ohta et al. | 360/324.11 |
| 6,181,534 B1 | * | 1/2001 | Gill | 360/324.11 |
| 6,430,012 B1 | * | 8/2002 | Sano et al. | 324/207.21 |

FOREIGN PATENT DOCUMENTS

| | | |
|---|---|---|
| JP | 8-21166 B2 | 3/1996 |
| JP | 8-235541 | 9/1996 |
| JP | 9-50611 | 2/1997 |
| JP | 2651015 B2 | 5/1997 |
| JP | 10-4226 | 1/1998 |
| JP | 10-116728 | 5/1998 |
| JP | 10-255231 | 9/1998 |
| JP | 11-86235 | 3/1999 |
| JP | 11-251141 | 9/1999 |
| JP | 2000-216020 | 8/2000 |

OTHER PUBLICATIONS

Thin Film Magnetoresistors In Memory, Storage and Related Applications by David A. Thompson, Lubomyr T Romankiw and A.F. Mayadas IEEE Transactions on Magnetics, vol. Mag–11, No. 4, Jul. 1975, pp. 1039–1050.

* cited by examiner

Primary Examiner—David L. Ometz
(74) Attorney, Agent, or Firm—Hayes Soloway P.C.

(57) ABSTRACT

A magnetic layer which is exchange-coupled to an antiferromagnetic layer and given an exchange bias therefrom is laminated via a non-magnetic layer on another magnetic layer to form an MR film. The antiferromagnetic layer (PtMn, PdMn or NiMn) is laminated on a ground layer(Zr, Hf, Zr—Hf, Zr—Co, Zr—Au, Ni—O, Co—O or Fe—O) so that the antiferromagnetic layer has a surface of an average roughness of 1–5 Å. A conduction layer is formed adjacent to the magnetic layer for sensing a magnetic field. The conduction layer is made of Cu, Ag, Au or an alloy composed of two selected therefrom. A layer made of Zr, Ta, Zr—O, Ta—O or a mixture thereof is laminated on the conduction layer. The MR film exhibits a large resistance variation linearly at near zero magnetic field with an excellent thermal stability.

30 Claims, 10 Drawing Sheets

1 : GROUND LAYER
2 : ANTIFERROMAGNETIC THIN FILM
3 A : MAGNETIC LAYER
3 B : NON-MAGNETIC LAYER
3 C : MAGNETIC LAYER
4 : NON-MAGNETIC THIN FILM
5 : MAGNETIC THIN FILM
6 : CONDUCTION LAYER
7 : PROTECTION LAYER
8 : MAGNETORESISTANCE FILM
9 : PERMANENT MAGNETIC THIN FILM OR ANTIFERROMAGNETIC THIN FILM
1 0 : SUBSTRATE

- 1 : GROUND LAYER
- 2 : ANTIFERROMAGNETIC THIN FILM
- 3 A : MAGNETIC LAYER
- 3 B : NON-MAGNETIC LAYER
- 3 C : MAGNETIC LAYER
- 4 : NON-MAGNETIC THIN FILM
- 5 : MAGNETIC THIN FILM
- 6 : CONDUCTION LAYER
- 7 : PROTECTION LAYER
- 8 : MAGNETORESISTANCE FILM
- 9 : PERMANENT MAGNETIC THIN FILM OR ANTIFERROMAGNETIC THIN FILM
- 10 : SUBSTRATE

1 : GROUND LAYER
2 : ANTIFERROMAGNETIC THIN FILM
3 A : MAGNETIC LAYER
3 B : NON-MAGNETIC LAYER
3 C : MAGNETIC LAYER
4 : NON-MAGNETIC THIN FILM
5 : MAGNETIC THIN FILM
6 : CONDUCTION LAYER
7 : PROTECTION LAYER

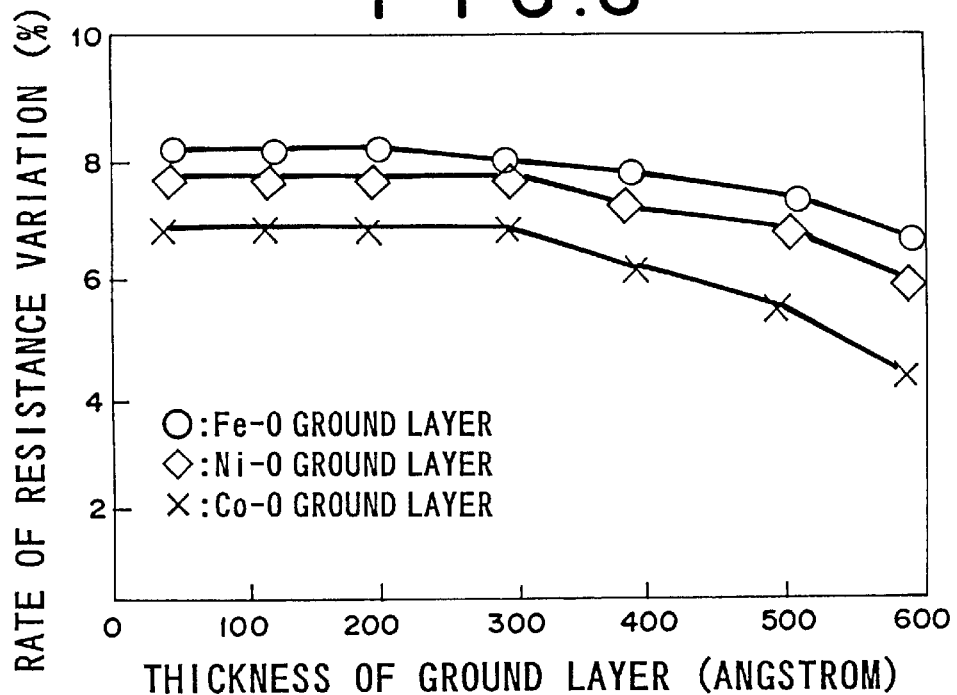
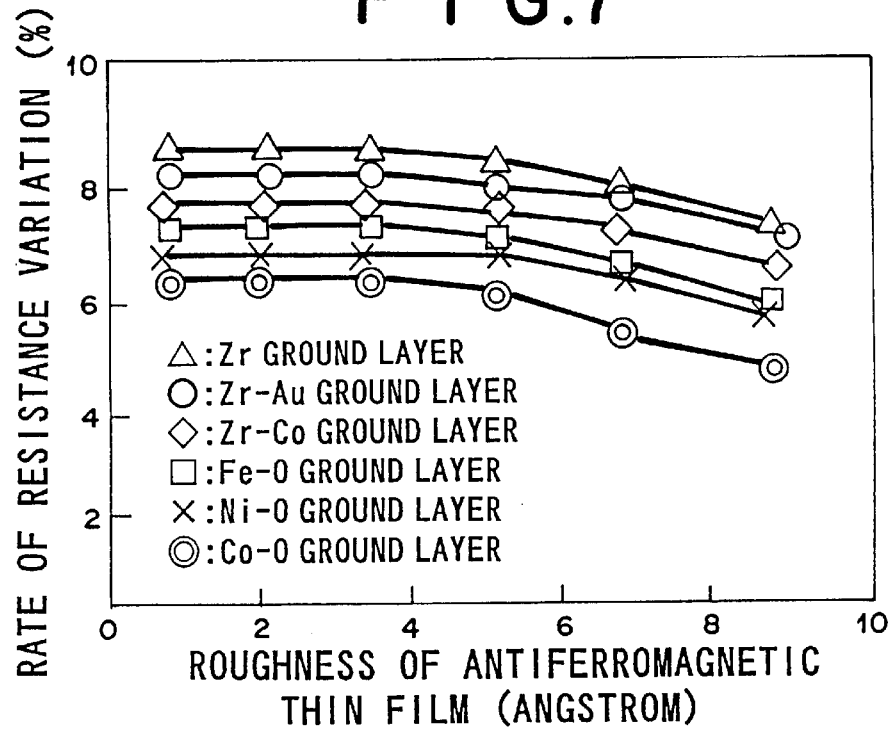

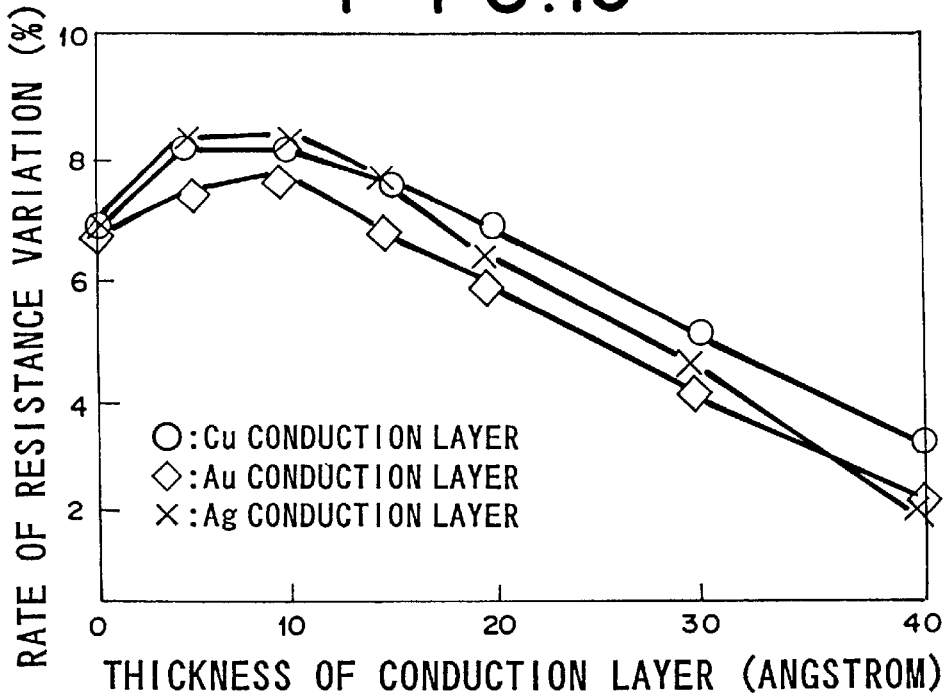
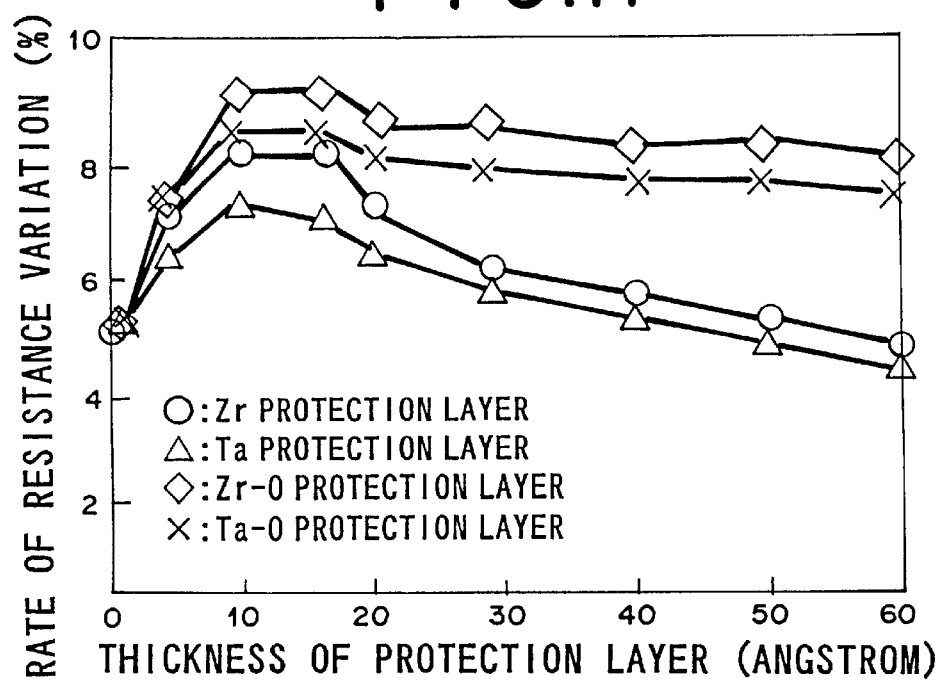

- 8 : MAGNETORESISTANCE FILM
- 9 : PERMANENT MAGNETIC THIN FILM OR ANTIFERROMAGNETIC THIN FILM
- 1 1 : ELECTRODE LAYER
- 1 2 : INSULATION LAYER
- 1 3 : INSULATION LAYER
- 1 4 : LOWER SHIELD LAYER
- 1 5 : UPPER SHIELD LAYER

- 8 : MAGNETORESISTANCE FILM
- 1 1 : ELECTRODE LAYER
- 1 6 : YOKE
- 1 7 : GROOVE (GLASS)
- 1 8 : FERRITE SUBSTRATE

MAGNETORESISTANCE EFFECT FILM AND DEVICE

BACKGROUND OF THE INVENTION

1. Field of the Invention

The present invention relates to a magnetoresistance effect device for reading a signal of magnetic field strength from a magnetic medium, and a magnetoresistance effect film for use in the device. More particularly, the present invention relates to a magnetoresistance effect film for generating a larger output under a smaller external magnetic field.

2. Description of the Related Art

A magnetoresistance(MR) sensor or head has been known in the art as a magnetic reading transcducer that can read data with a larger linear density from a magnetic surface. The MR sensor detects a magnetic field through a resistance variation that is a function of an intensity and direction of a magnetic flux sensed by a magnetic reading device. Such a conventional MR sensor operates on the basis of the anisotropic magnetoresistance (AMR) effect. The AMR effect is known to vary one component of a resistance in the magnetic reading device proportional to the square of cosine of an angle between the magnetization direction of the device and the direction of a sense current flowing through the device. D. A. Thompson et al., "Memory, Storage and Related Applications", IEEE Trans. on Mag., MAG-11, P.1039 (1975) describes the AMR effect in more details.

A further recent report demonstrates a more remarkable MR effect that can cause resistance variations in a laminated magnetic sensor due to the spin-dependent transmission of conduction electrons between magnetic layers via a non-magnetic layer and due to the accompanying spin-dependent scattering at the interfaces thereof. This MR effect is called with various names such as "giant magnetoresistive effect", "spin valve effect", etc. This MR sensor is composed of appropriate materials and has a more improved recording density and larger resistance variation than that of the AMR sensor. In a plane between a pair of ferromagnetic layers that are isolated by a non-magnetic layer in such an MR sensor, a resistance varies proportionally to the cosine of an angle between the magnetization directions of the two ferromagnetic layers.

JP-2651015(B2) publication discloses a laminated magnetic structure that causes a high MR variation due to the anti-parallel arrangement of magnetization between magnetic layers. The publication exemplifies transition metals and alloys as materials useful for the ferromagnetic layers in the laminated structure. It also discloses a structure that includes an antiferromagnetic layer, appropriately FeMn layer, added onto one of at least two ferromagnetic layers isolated by an intermediate layer.

JP-8-21166(B2) discloses another MR sensor that includes two thin film layers of ferromagnetic material separated by a thin film layer of non-magnetic metal. At no magnetic field application, the magnetization directions of the two ferromagnetic thin film layers cross at right angle with each other. A resistance between the two uncoupled ferromagnetic layers varies proportional to cosine of an angle between the magnetization directions of the two layers and is independent of the direction of a current flowing through the sensor.

Although these MR devices can work in a small magnetic field, they have a disadvantage because of a low Neel temperature of FeMn and poor thermal stability when they are employed for practical sensors and magnetic heads.

The use of high Neel temperature PtMn, PdMn and NiMn for the ferromagnetic thin film requires an appropriate heating process to obtain an antiferromagnetic phase. This heating process causes the disadvantage of reducing the resistance variation rate, which is the output from the device.

Thinning the magnetic layer to increase the device sensitivity to the magnetic field, elevates the resistance due to the effect of electron scattering on the surface of the MR film and accordingly reduces the MR effect, lowering the output.

SUMMARY OF THE INVENTION

An object of the present invention is to provide a magnetoresistance effect film and device capable of exhibiting a large resistance variation linearly at near zero magnetic field with an excellent thermal stability.

According to the present invention, there is also provided a magnetoresistance effect film on a substrate, which comprises a plurality of magnetic thin films, a non-magnetic thin film disposed between the magnetic thin films, and an antiferromagnetic thin film arranged adjacent to one of a pair of magnetic thin films laminated via a non-magnetic layer. The antiferromagnetic thin film has an exchange bias field of $H_r$. The other of the pair of magnetic-thin films has a coercive force of $H_{c2}$ lower than $H_r$. The magnetoresistance effect film further comprises a ground layer formed on the substrate. The antiferromagnetic thin film is laminated adjacent to the ground layer. Material of the ground layer is selected from the group consisting of a nickel oxide, a cobalt oxide, an iron oxide and an alloy composed of at least two selected therefrom. Material of the antiferromagnetic thin film is selected from the group consisting of PtMn, PdMn, NiMn and an alloy composed of at least two selected therefrom. The antiferromagnetic thin film has a surface with an average roughness 1–5 Å.

According to the present invention, there is also provided a magnetoresistance effect film on a substrate, which comprises a plurality of magnetic thin films, a non-magnetic thin film disposed between the magnetic thin films, and an antiferromagnetic thin film arranged adjacent to one of a pair of magnetic thin films laminated via a non-magnetic layer. The antiferromagnetic thin film has an exchange bias field of $H_r$. The other of the pair of magnetic thin films has a coercive force of $H_{c2}$ lower than $H_r$. The magnetoresistance effect film further comprises a ground layer formed on the substrate. The antiferromagnetic thin film is laminated adjacent to the ground layer. Material of the ground layer is selected from the group consisting of a nickel oxide, a cobalt oxide, an iron oxide and an alloy composed of at least two selected therefrom. Matereial of the antiferromagnetic thin film is selected from the group consisting of PtMn, PdMn, NiMn and an alloy composed of at least two selected therefrom. The antiferromagnetic thin film has a surface with an average roughness of 1–5 Å.

BRIEF DESCRIPTION OF THE DRAWINGS

FIG. 6 shows a dependency of the resistance variation rate on the thickness of the ground layer in the MR film of the present invention;

FIG. 7 shows a dependency of the resistance variation rate on an average roughness at a surface of an antiferromagnetic thin film in the MR film of the present invention;

FIG. 10 shows a dependency of the resistance variation rate on a thickness of a conduction layer in the MR film of the present invention;

FIG. 11 shows a dependency of the resistance variation rate on a thickness of a protection layer in the MR film of the present invention;

DETAILED DESCRIPTION OF THE PREFERRED EMBODIMENT

Figure 1:
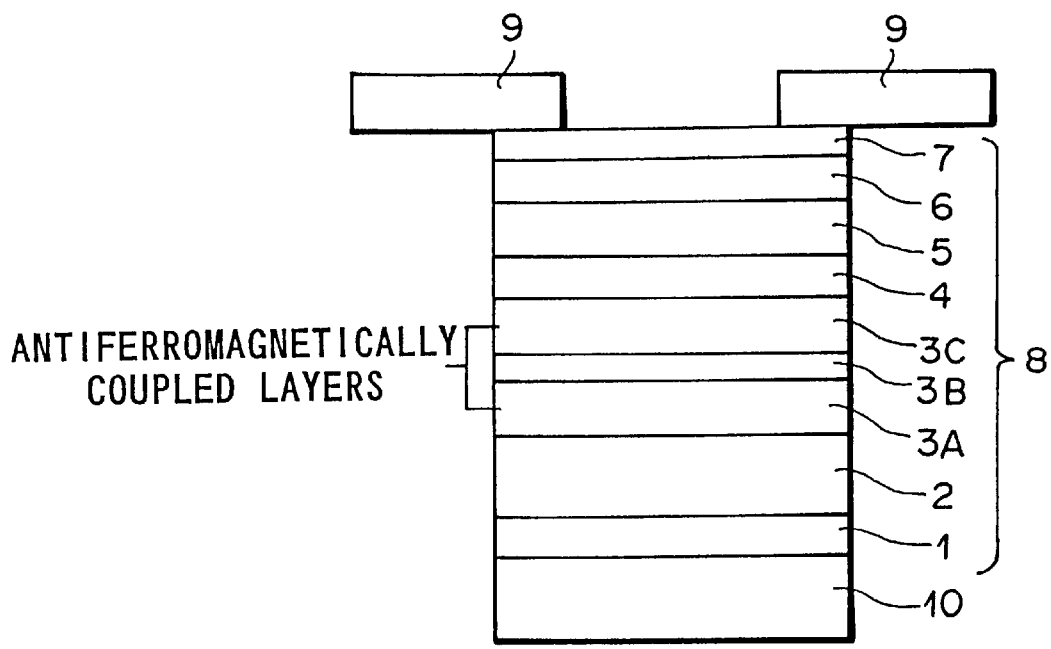
FIG. 1 is a side view showing part of an MR film according to the present invention.

Preferred embodiments of the present invention will be described with reference to the accompanying drawings.

The present invention is directed to material of the ground layer and a laminated structure for use in a magnetoresistance (MR) effect film. The MR film comprises a plurality of magnetic and non-magnetic thin films alternately laminated on a substrate. An antiferromagnetic thin film is arranged adjacent to one of a pair of magnetic thin films laminated via a non-magnetic thin film. The antiferromagnetic thin film has an exchange bias field of $H_r$. The other of the pair of magnetic thin films has a coercive force of $H_{c2}$ lower than $H_r$.

The ground layer serves to improve the planarity of the MR film and the sharpness of an interface in a multi-layered film. Preferably, the material of the ground layer is selected from the group consisting of Zr, Hf, and an alloy thereof, Zr—Au and Zr—Co. It is also selected from the group consisting of a nickel oxide, a cobalt oxide, an iron oxide and an alloy composed of at least two selected therefrom.

In the case of the ground layer made of Zr, Hf, an alloy thereof, Zr—Au or Zr—Co, it is preferable to have a thickness of 10–100 Å. If the thickness is less than 10 Å, the ground layer loses its effect. If it exceeds 100 Å, the resistance variation rate of the MR film lowers due to a current branching to the ground layer.

In the case of the ground layer made of a nickel oxide, a cobalt oxide, an iron oxide or an alloy composed of at least two selected therefrom, it is preferable to have a thickness of 10–500 Å. If the thickness is less than 10 Å, the ground layer loses its effect. If it exceeds 500 Å, the MR device fabricated with use of the MR film as a component has a too large gap between shield layers to maintain its reading precision.

Antiferromagnetic materials for use in the antiferromagnetic thin film are selected from the group consisting of PtMn, PdMn, NiMn and an alloy composed of at least two selected therefrom. The antiferromagnetic thin film preferably has a thickness of 50–350 Å. A thickness less than 50 Å reduces a phase variation of the film not enough to generate a sufficient exchange bias field. There is no particular upper limit for obtaining the exchange bias field. A thickness over 350 Å, however, elongates the gap between shield layers of the MR device and degrades the reading precision for external signals.

Lamination of the antiferromagnetic thin film adjacent to the ground layer can improve the planarity of the layer structure in the MR film to achieve a larger resistance variation rate. The ground layer can improve an average roughness of a surface of the antiferromagnetic thin film and can reduce it preferably down to 1–5 Å. The average roughness of the film over 5 Å increases an average roughness of an interface in the magnetic multi-layered film laminated on the antiferromagnetic thin film and reduces the scattering effect that depends on the spin of conduction electrons. The average roughness of the film between 1–5 Å sharpens the interface and greatly improves the resistance variation rate reduced through a heating process.

Heating the antiferromagnetic thin film and the magnetic thin film adjacent thereto at 200–300° C. in a magnetic field can realize one-directional anisotropy in the magnetic thin film.

The non-magnetic thin film is made of such a material that serves to weaken the magnetic interaction between magnetic thin films. It is selected from the group consisting of Cu, Au, Ag, Ru, Al and an alloy composed of at least two selected therefrom. The non-magnetic thin film preferably has a thickness of 20–35 Å. If the thickness exceeds 35 Å, the non-magnetic thin film itself determines the resistance of the MR film in general and lowers the spin-dependent scattering effect relatively, resulting in a smaller rate of the magnetic resistance variation. A thickness less than 20 Å on the other hand excessively increases the magnetic interaction between the magnetic thin films and inevitably generates a magnetic direct contact(pinhole), making it difficult to allow both magnetic thin films to have different magnetization directions.

The magnetic thin film preferably comprises a magnetic material selected from Ni, Fe, Co, FeCo, NiFe, NiFeCo and an alloy thereof. These magnetic materials can increase the scattering effect of conduction electrons at the interface between the non-magnetic and magnetic layers, causing a larger resistance variation.

The above magnetic materials are selectively employed to form the magnetic thin film. In particular, it is practical to select a material that gives an anisotropic magnetic field $H_{k2}$ larger than the coercive force $H_{c2}$ to the magnetic thin film not adjoining the antiferromagnetic thin film.

Thinning the film thickness can also increase the anisotropic magnetic field. For example, 10 Å thick NiFe film can realize a larger anisotropic magnetic field $H_{k2}$ than the coercive force $H_{c2}$.

To produce the MR film, the magnetic thin film is formed in a magnetic field. This film formation requires the magnetic thin film to have the easy magnetization direction or axis normal to the direction of the applied signal magnetic field; and the coercive force $H_{c2}$ satisfies the relationship $H_{c2} < H_{k2} < H_r$ along the direction of the applied signal magnetic field. A 90 degrees rotation of the applied magnetic field or 90 degrees rotation of the substrate in the magnetic field can be employed specifically during the film formation. This rotation allows the easy magnetization direction of one magnetic film adjacent to the antiferromagnetic film to cross at right angle with the easy magnetization direction of the other magnetic film adjacent to the one magnetic film via the non-magnetic film.

Each magnetic thin film is preferable to have a thickness of 80 Å or less. A thickness over 80 Å enlarges areas not contributing to the electron scattering and reduces the giant magnetoresistive effect as the thickness increases. There is no particular lower limit to the thickness of the magnetic film. A thickness below 3 Å, however, causes discontinuous parts in the magnetic thin film, resulting in a smaller magnetic resistance variation. A thickness of 3 Å or more can easily retain a uniform film thickness with an improved characteristic. It can also prevent the saturation magnetization from decreasing to a too low magnitude.

Interposition of Co, FeCo or NiFeCo into the interface between the magnetic and non-magnetic thin films can elevate a probability of the conduction electron scattering at the interface, achieving a much larger resistance variation. The interposed film has a lower limit of the thickness equal to 1 Å. A thickness below 1 Å reduces the effect of the interposition and has a difficulty in controlling the thickness. There is no particular upper limit to the thickness of the interposed film but about 20 Å is desirable. A thickness over 20 Å degrades the soft magnetic property of the magnetic layer for detecting the magnetic field and causes a hysteresis in the operation range of the MR device.

The magnetic thin film adjacent to the antiferromagnetic thin film can be replaced with an antiferromagnetically coupled three-layered film consisting of magnetic/non-magnetic/magnetic layers. This replacement can remarkably elevate the exchange bias field by the antiferromagnetic thin film and can improve the thermal stability of the MR device. In addition, it can decrease the magnetostatic interaction between the magnetic thin film for detecting the magnetic field and the magnetic thin film adjacent to the antiferromagnetic thin film, improving the output of the MR device.

Preferably, material of the non-magnetic layer in the above three-layered film is Ru, Cr, Rh or an alloy composed of at least two selected therefrom. It increases the saturation magnetic field of the three-layered film and improves the thermal stability of the MR device. It can also prevent the resistance variation from lowering due to the branched current of conduction electrons because Ru, Cr and Rh have large resistivities. The non-magnetic layer in the three-layered film has a thickness of 4–10 Å, which can generate an extremely large antiferromagnetically coupled magnetic field.

The magnetic layer in the three-layered film is composed of Co, FeCo, NiFe or NiFeCo. It can realize a large antiferromagnetic coupling and achieves a large resistance variation.

A conduction layer is formed adjacent to the magnetic thin film that senses the magnetic field. The conduction layer consists of Cu, Ag, Au or an alloy composed of at least two selected therefrom. It can prevent the conduction electrons from non-elastically scattering on the surface of the MR film and causes a much larger resistance variation. The conduction layer preferably has a thickness of 3–30 Å. A thickness below 3 Å tends to cause discontinuous parts in the conduction layer, reducing its effect extremely. A thickness over 30 Å reduces the giant magnetoresistive effect due to the effect of the branched current of conduction electrons, lowering the output of the MR device.

Lamination of Zr or Ta layer adjacent to the conduction layer can suppress the conduction layer and magnetic thin film to be oxidized. It also reduces the effect of the branched current of the conduction electrons and maintains a large resistance variation because Zr or Ta has a large resistivity. Lamination of a zirconium oxide or tantalum oxide layer adjacent to the conduction layer achieves a much larger resistance variation rate. The layer adjacent to the conduction layer can be replaced with a mixture of Zr and zirconium oxide or mixture of Ta and tantalum oxide with the similar effect.

The layer adjacent to the conduction layer preferably has a thickness of 5–50 Å. A thickness less than 5 Å easily generates pinholes and oxidizes the magnetic thin film. A thickness more than 50 Å reduces the resistance variation due to the branched current of conduction electrons.

To stabilize magnetic domains and avoid a non-linear output such as Barkhausen jump in the MR film, a permanent magnetic thin film is laminated adjacent to the magnetic thin film or layer that senses an external magnetic field and is not directly adjacent to the antiferromagnetic layer. The permanent magnetic thin film is preferably composed of CoCr, CoCrTa, CoCrTaPt, CoCrPt, CoNiPt, CoNiCr, CoCrPtSi or FeCoCr. Cr is useful as a ground layer for the permanent magnetic thin film.

The substrate is prefereably composed of glass, Si, MgO, $Al_2O_3$, GaAs, ferrite, $CaTi_2O_3$, $BaTi_2O_3$ or $Al_2O_3$—TiC.

The thickness of the magnetic or non-magnetic thin film or layer can be measured with a transmission electron microscope, scanning electron microscope or Auger electron spectroscopy. A crystal structure of the thin film or layer can be determined with an X-ray diffraction or high-energy electron beam diffraction method.

The number, N, of artificial lattice films repeatedly laminated has no particular limitation. Rather, it can be selected in accordance with a target variation rate of the magnetic resistance, for example. The antiferromagnetic thin film has a large resistivity and thus loses the effect of the MR device if it is laminated internally. Therefore, it is preferable to realize a structure of antiferromagnetic/magnetic/non-magnetic/magnetic/non-magnetic/magnetic/antiferromagnetic layers. An antioxidization film such as silicon nitride, silicon oxide and aluminum oxide and/or a metallic conductive layer for drawing out an electrode may be disposed on the upper surface of the uppermost layer in the structure.

It is essentially required for the MR film of the present invention to form the antiferromagnetic thin film adjacent to one of adjoining magnetic thin films to apply an exchange bias magnetic field. This is because the maximum resistance appears in principle when the magnetization directions of the adjoining magnetic thin films oppose each other. This occurs, as shown in FIG. 3, when an external magnetic field H is located between an anisotropic magnetic field $H_{k2}$ of the magnetic thin film and a coercive force $H_r$ of the other magnetic thin film, that is, $H_{k2}<H<H_r$, and increases the resistance.

Figure 2:
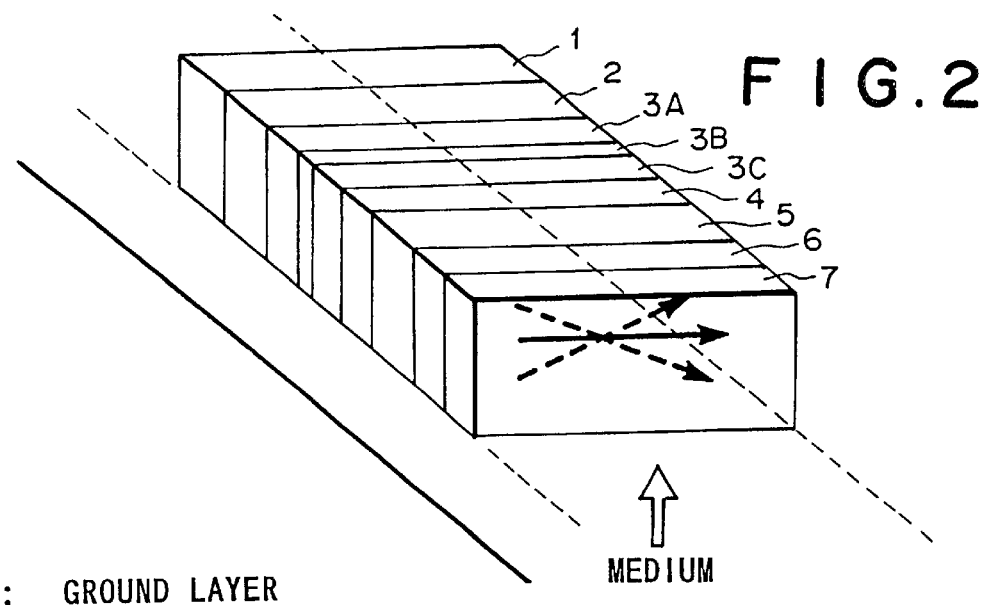
FIG. 2 is a perspective view showing an embodiment of an MR sensor according to the present invention.

FIG. 2 is a perspective view showing an embodiment of an MR sensor using the MR film of the present invention. The MR sensor comprises an MR film 8 formed on a substrate 10 as shown in FIG. 1. A ground layer 1 and an antiferromagnetic thin film 2 are formed on the substrate 10. Magnetic thin films 3 and 5 are arranged to have their easy magnetization directions crossing to each other at right angle. The magnetic thin film 3 comprises magnetic layers 3A, 3C and a non-magnetic layer 3B interposed therebetween. The non-magnetic layer 4 is interposed between the magnetic thin films 3 and 5. The easy magnetization direction of the magnetic thin film 5 is determined to cross a magnetic signal field generated from a magnetic storage medium at right angle. An exchange bias magnetic field is applied to the magnetic thin film 3 from the adjacent antiferromagnetic thin film 2 to impart one-directional anisotropy on it. The resistance varies when the magnetization direction of the magnetic thin film 5 rotates in response to the magnitude of the signal field from the magnetic storage medium. Thus, the magnetic field can be detected.

A relationship among an external magnetic field, a coercive force and the magnetization direction will be described hereunder.

Figure 3:
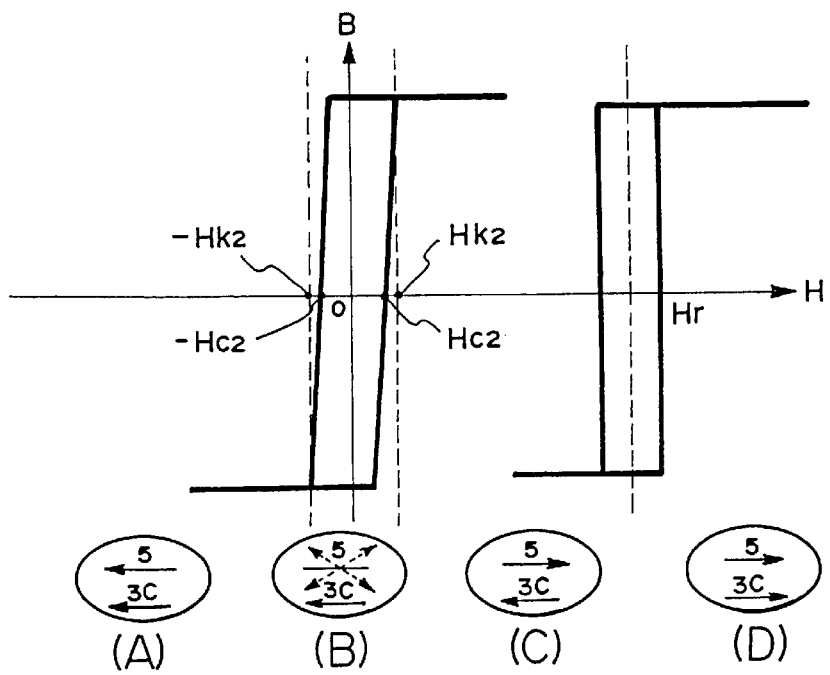
FIG. 3 shows B-H curves illustrating the operational principle of the MR film of the present invention.

As shown in FIG. 3, it is assumed that $H_r$ denotes the coercive force of the exchange-biased magnetic thin film, $H_{c2}$ and $H_{k2}$ the coercive force and magnetization direction of the other magnetic thin film ($0<H_{k2}<H_r$). The external magnetic field H is applied first so as to satisfy $H<-H_{k2}$ (region A). At this moment, the magnetization directions of the magnetic layer 3C and magnetic thin film 5 both direct toward the minus (−) direction as well as H. As the external field increases in plus direction, the magnetization of the magnetic thin film rotates to the plus (+) direction within $-H_{k2}<H<H_{k2}$ (region B), and then the magnetization directions of the magnetic layer 3C and magnetic thin film 5 oppose to each other within $H_{k2}<H<H_r$ (region C). When the external field further increases, the magnetization direction of the magnetic layer 3C also rotates to the plus (+) direction within $H_r<H$ (region D), and the magnetization directions of the magnetic layer 3C and magnetic thin film 5 direct to the same plus (+) direction.

Figure 4:
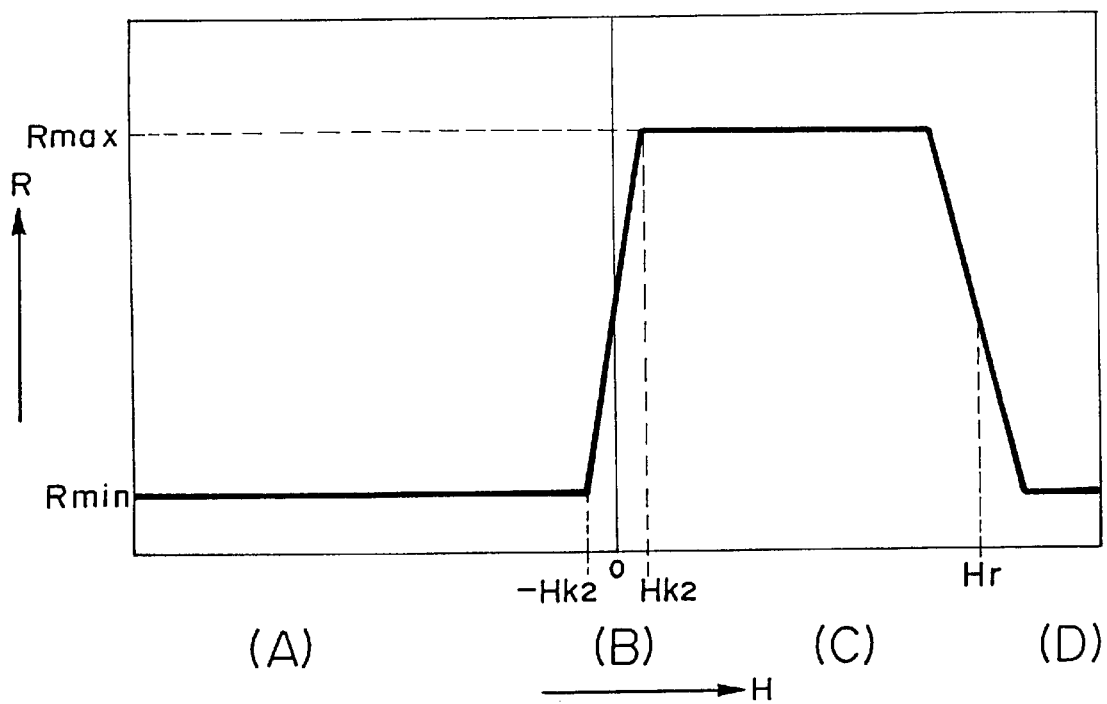
FIG. 4 shows an R-H curve illustrating the operational principle of the MR film of the present invention.

As shown in FIG. 4, the resistance of this film varies in accordance with the relative magnetization directions of the magnetic layer 3C and magnetic thin film 5. It varies linearly at near zero field and exhibits the maximum value ($R_{max}$) in the region(C).

The MR device of the present invention will be further descried with reference to the accompanying drawings.

FIG. 1 is a cross sectional view showing the MR film 8 according to the embodiment of the present invention. The MR film 8 is formed on the substrate 10 that includes the ground layer 1 and the antiferromagnetic thin film 2 formed thereon. The MR film 8 includes the magnetic thin film 3 consisting of antiferromagnetically-coupled magnetic layers 3A, 3C and a non-magnetic layer 3B interposed therebetween, and the magnetic thin film 5, interposing the non-magnetic thin film 4 between two adjacent magnetic thin films. The magnetic thin film 5 comprises a layer mainly composed of a metal or alloy selected from the group consisting of Ni, Fe, Co, FeCo, NiFe and NiFeCo. An antiferromagnetic thin film or permanent magnetic thin film 9 is disposed adjacent to the magnetic thin film 5.

A glass substrate is put into a vacuum chamber, which evacuates inside down to $10^{-7}$ Torr or less. While maintaining the substrate at room temperature, a ground layer(Zr, Hf, Zr—Au, Zr—Co), an antiferromagnetic layer, magnetic and non-magnetic layers are formed on the substrate. A magnetic field is rotated by 90 degrees relative to the substrate during the film formation. This rotation allows the easy magnetization direction or axis of the exchange-coupled layer to cross at right angle with the easy magnetization direction of the magnetic layer adjacent via the non-magnetic film to the exchangingly coupled layer. Finally, the MR film obtained is put into a furnace to heat it at 200–300° C. in a DC magnetic field of 3–10 kOe applied in the easy magnetization direction of the exchangingly coupled layer.

The film formation was performed specifically in such a situation that NdFeB magnets are arranged at both sides of the glass substrate to apply an external magnetic field of about 300 Oe in parallel to the glass substrate. This sample was measured and determined to have a B-H curve, which indicated that the direction of the magnetic field applied during film formation was coincident with the easy magnetization direction or axis of the magnetic layer.

A film formation at a rate of about 0.8–2.0 Å/sec was performed to form the antiferromagnetic, magnetic and non-magnetic films or layers in the MR film shown below. An exemplary indication of glass/Zr(30)/PtMn(250)/CoFe (30)/Cu(25)/CoFe(10)/NiFe(60)/Cu(10)/Zr(30) means to form thin films of Zr 30 Å, antiferromagnetic PtMn 250 Å, CoFe 30 Å, Cu 25 Å, CoFe 10 Å, NiFe 60 Å, Cu 10 Å and Zr 30 Å thick in this order on a glass substrate.

A vibrating sample magnetometer was employed to measure the magnetization. A four-terminal method was employed to measure the resistance of a piece 1.0×10 mm² prepared from the sample in the external magnetic field applied in the direction along the surface of the film and normal to the current, while varying the external magnetic field from −700 to 700 Oe. A variation rate of the magnetic resistance, ΔR/R, was obtained from the resistances. The resistance variation rate ΔR/R was calculated by the following equation:

$$\Delta R/R = (R\text{max} - R\text{min})/R\text{min} \times 100[\%]$$

where Rmax denotes the maximum resistance and Rmin the minimum resistance.

The produced spin valve films are shown below.

1. Ground Layer: Zr
   a. glass/Zr(10–100)/NiMn(30–400)/CoFe(10–100)/Cu (15–40)/CoFe(1–40)/NiFe(1–100)/Cu(3–30)/Zr(5–50)
   b. glass/Zr(10–100)/NiMn(30–400)/CoFe(10–100)/Cu (15–40)/CoFe(1–40)/NiFe(1–100)/Cu(3–30)/Ta(5–50)
   c. glass/Zr(10–100)/NiMn(30–400)/CoFe(10–100)/Cu (15–40)/CoFe(1–40)/NiFe(1–100)/Cu(3–30)/Zr—O (5–50)
   d. glass/Zr(10–100)/NiMn(30–400)/CoFe(10–100)/Cu (15–40)/CoFe(1–40)/NiFe(1–100)/Cu(3–30)/Ta—O (5–50)
   e. glass/Zr(10–100)/PdMn(30–400)/CoFe(10–100)/Cu (15–40)/CoFe(1–40)/NiFe(1–100)/Cu(3–30)/Zr(5–50)
   f. glass/Zr(10–100)/PdMn(30–400)/CoFe(10–100)/Cu (15–40)/CoFe(1–40)/NiFe(1–100)/Cu(3–30)/Ta(5–50)
   g. glass/Zr(10–100)/PdMn(30–400)/CoFe(10–100)/Cu (15–40)/CoFe(1–40)/NiFe(1–100)/Cu(3–30)/Zr—O (5–50)
   h. glass/Zr(10–100)/PdMn(30–400)/CoFe(10–100)/Cu (15–40)/CoFe(1–40)/NiFe(1–100)/Cu(3–30)/Ta—O (5–50)
   i. glass/Zr(10–100)/PtMn(30–400)/CoFe(10–100)/Cu (15–40)/CoFe(1–40)/NiFe(1–100)/Cu(3–30)/Zr(5–50)

j. glass/Zr(10–100)/PtMn(30–400)/CoFe(10–100)/Cu(15–40)/CoFe(1–40)/NiFe(1–100)/Cu(3–30)/Ta(5–50)
k. glass/Zr(10–100)/PtMn(30–400)/CoFe(10–100)/Cu(15–40)/CoFe(1–40)/NiFe(1–100)/Cu(3–30)/Zr—O(5–50)
l. glass/Zr(10–100)/PtMn(30–400)/CoFe(10–100)/Cu(15–40)/CoFe(1–40)/NiFe(1–100)/Cu(3–30)/Ta—O(5–50)

2. Ground Layer: Hf
   a. glass/Hf(10–100)/NiMn(30–400)/CoFe(10–100)/Cu(15–40)/CoFe(1–40)/NiFe(1–100)/Cu(3–30)/Zr(5–50)
   b. glass/Hf(10–100)/NiMn(30–400)/CoFe(10–100)/Cu(15–40)/CoFe(1–40)/NiFe(1–100)/Cu(3–30)/Ta(5–50)
   c. glass/Hf(10–100)/NiMn(30–400)/CoFe(10–100)/Cu(15–40)/CoFe(1–40)/NiFe(1–100)/Cu(3–30)/Zr—O(5–50)
   d. glass/Hf(10–100)/NiMn(30–400)/CoFe(10–100)/Cu(15–40)/CoFe(1–40)/NiFe(1–100)/Cu(3–30)/Ta—O(5–50)
   e. glass/Hf(10–100)/PdMn(30–400)/CoFe(10–100)/Cu(15–40)/CoFe(1–40)/NiFe(1–100)/Cu(3–30)/Zr(5–50)
   f. glass/Hf(10–100)/PdMn(30–400)/CoFe(10–100)/Cu(15–40)/CoFe(1–40)/NiFe(1–100)/Cu(3–30)/Ta(5–50)
   g. glass/Hf(10–100)/PdMn(30–400)/CoFe(10–100)/Cu(15–40)/CoFe(1–40)/NiFe(1–100)/Cu(3–30)/Zr—O(5–50)
   h. glass/Hf(10–100)/PdMn(30–400)/CoFe(10–100)/Cu(15–40)/CoFe(1–40)/NiFe(1–100)/Cu(3–30)/Ta—O(5–50)
   i. glass/Hf(10–100)/PtMn(30–400)/CoFe(10–100)/Cu(15–40)/CoFe(1–40)/NiFe(1–100)/Cu(3–30)/Zr(5–50)
   j. glass/Hf(10–100)/PtMn(30–400)/CoFe(10–100)/Cu(15–40)/CoFe(1–40)/NiFe(1–100)/Cu(3–30)/Ta(5–50)
   k. glass/Hf(10–100)/PtMn(30–400)/CoFe(10–100)/Cu(15–40)/CoFe(1–40)/NiFe(1–100)/Cu(3–30)/Zr—O(5–50)
   l. glass/Hf(10–100)/PtMn(30–400)/CoFe(10–100)/Cu(15–40)/CoFe(1–40)/NiFe(1–100)/Cu(3–30)/Ta—O(5–50)

3. Ground Layer: Zr—Hf
   a. glass/Zr—Hf(10–100)/NiMn(30–400)/CoFe(10–100)/Cu(15–40)/CoFe(1–40)/NiFe(1–100)/Cu(3–30)/Zr(5–50)
   b. glass/Zr—Hf(10–100)/NiMn(30–400)/CoFe(10–100)/Cu(15–40)/CoFe(1–40)/NiFe(1–100)/Cu(3–30)/Ta(5–50)
   c. glass/Zr—Hf(10–100)/NiMn(30–400)/CoFe(10–100)/Cu(15–40)/CoFe(1–40)/NiFe(1–100)/Cu(3–30)/Zr—O(5–50)
   d. glass/Zr—Hf(10–100)/NiMn(30–400)/CoFe(10–100)/Cu(15–40)/CoFe(1–40)/NiFe(1–100)/Cu(3–30)/Ta—O(5–50)
   e. glass/Zr—Hf(10–100)/PdMn(30–400)/CoFe(10–100)/Cu(15–40)/CoFe(1–40)/NiFe(1–100)/Cu(3–30)/Zr(5–50)
   f. glass/Zr—Hf(10–100)/PdMn(30–400)/CoFe(10–100)/Cu(15–40)/CoFe(1–40)/NiFe(1–100)/Cu(3–30)/Ta(5–50)
   g. glass/Zr—Hf(10–100)/PdMn(30–400)/CoFe(10–100)/Cu(15–40)/CoFe(1–40)/NiFe(1–100)/Cu(3–30)/Zr—O(5–50)
   h. glass/Zr—Hf(10–100)/PdMn(30–400)/CoFe(10–100)/Cu(15–40)/CoFe(1–40)/NiFe(1–100)/Cu(3–30)/Ta—O(5–50)
   i. glass/Zr—Hf(10–100)/PtMn(30–400)/CoFe(10–100)/Cu(15–40)/CoFe(1–40)/NiFe(1–100)/Cu(3–30)/Zr(5–50)
   j. glass/Zr—Hf(10–100)/PtMn(30–400)/CoFe(10–100)/Cu(15–40)/CoFe(1–40)/NiFe(1–100)/Cu(3–30)/Ta(5–50)
   k. glass/Zr—Hf(10–100)/PtMn(30–400)/CoFe(10–100)/Cu(15–40)/CoFe(1–40)/NiFe(1–100)/Cu(3–30)/Zr—O(5–50)
   l. glass/Zr—Hf(10–100)/PtMn(30–400)/CoFe(10–100)/Cu(15–40)/CoFe(1–40)/NiFe(1–100)/Cu(3–30)/Ta—O(5–50)

4. Ground Layer: Zr—Au
   a. glass/Zr—Au(10–100)/NiMn(30–400)/CoFe(10–100)/Cu(15–40)/CoFe(1–40)/NiFe(1–100)/Cu(3–30)/Zr(5–50)
   b. glass/Zr—Au(10–100)/NiMn(30–400)/CoFe(10–100)/Cu(15–40)/CoFe(1–40)/NiFe(1–100)/Cu(3–30)/Ta(5–50)
   c. glass/Zr—Au(10–100)/NiMn(30–400)/CoFe(10–100)/Cu(15–40)/CoFe(1–40)/NiFe(1–100)/Cu(3–30)/Zr—O(5–50)
   d. glass/Zr—Au(10–100)/NiMn(30–400)/CoFe(10–100)/Cu(15–40)/CoFe(1–40)/NiFe(1–100)/Cu(3–30)/Ta—O(5–50)
   e. glass/Zr—Au(10–100)/PdMn(30–400)/CoFe(10–100)/Cu(15–40)/CoFe(1–40)/NiFe(1–100)/Cu(3–30)/Zr(5–50)
   f. glass/Zr—Au(10–100)/PdMn(30–400)/CoFe(10–100)/Cu(15–40)/CoFe(1–40)/NiFe(1–100)/Cu(3–30)/Ta(5–50)
   g. glass/Zr—Au(10–100)/PdMn(30–400)/CoFe(10–100)/Cu(15–40)/CoFe(1–40)/NiFe(1–100)/Cu(3–30)/Zr—O(5–50)
   h. glass/Zr—Au(10–100)/PdMn(30–400)/CoFe(10–100)/Cu(15–40)/CoFe(1–40)/NiFe(1–100)/Cu(3–30)/Ta—O(5–50)
   i. glass/Zr—Au(10–100)/PtMn(30–400)/CoFe(10–100)/Cu(15–40)/CoFe(1–40)/NiFe(1–100)/Cu(3–30)/Zr(5–50)
   j. glass/Zr—Au(10–100)/PtMn(30–400)/CoFe(10–100)/Cu(15–40)/CoFe(1–40)/NiFe(1–100)/Cu(3–30)/Ta(5–50)
   k. glass/Zr—Au(10–100)/PtMn(30–400)/CoFe(10–100)/Cu(15–40)/CoFe(1–40)/NiFe(1–100)/Cu(3–30)/Zr—O(5–50)
   l. glass/Zr—Au(10–100)/PtMn(30–400)/CoFe(10–100)/Cu(15–40)/CoFe(1–40)/NiFe(1–100)/Cu(3–30)/Ta—O(5–50)

5. Ground Layer: Zr—Co
   a. glass/Zr—Co(10–100)/NiMn(30–400)/CoFe(10–100)/Cu(15–40)/CoFe(1–40)/NiFe(1–100)/Cu(3–30)/Zr(5–50)
   b. glass/Zr—Co(10–100)/NiMn(30–400)/CoFe(10–100)/Cu(15–40)/CoFe(1–40)/NiFe(1–100)/Cu(3–30)/Ta(5–50)
   c. glass/Zr—Co(10–100)/NiMn(30–400)/CoFe(10–100)/Cu(15–40)/CoFe(1–40)/NiFe(1–100)/Cu(3–30)/Zr—O(5–50)
   d. glass/Zr—Co(10–100)/NiMn(30–400)/CoFe(10–100)/Cu(15–40)/CoFe(1–40)/NiFe(1–100)/Cu(3–30)/Ta—O(5–50)
   e. glass/Zr—Co(10–100)/PdMn(30–400)/CoFe(10–100)/Cu(15–40)/CoFe(1–40)/NiFe(1–100)/Cu(3–30)/Zr(5–50)

f. glass/Zr—Co(10–100)/PdMn(30–400)/CoFe(10–100)/Cu(15–40)/CoFe(1–40)/NiFe(1–100)/Cu(3–30)/Ta (5–50)

g. glass/Zr—Co(10–100)/PdMn(30–400)/CoFe(10–100)/Cu(15–40)/CoFe(1–40)/NiFe(1–100)/Cu(3–30)/Zr—O (5–50)

h. glass/Zr—Co(10–100)/PdMn(30–400)/CoFe(10–100)/Cu(15–40)/CoFe(1–40)/NiFe(1–100)/Cu(3–30)/Ta—O (5–50)

i. glass/Zr—Co(10–100)/PtMn(30–400)/CoFe(10–100)/Cu(15–40)/CoFe(1–40)/NiFe(1–100)/Cu(3–30)/Zr (5–50)

j. glass/Zr—Co(10–100)/PtMn(30–400)/CoFe(10–100)/Cu(15–40)/CoFe(1–40)/NiFe(1–100)/Cu(3–30)/Ta (5–50)

k. glass/Zr—Co(10–100)/PtMn(30–400)/CoFe(10–100)/Cu(15–40)/CoFe(1–40)/NiFe(1–100)/Cu(3–30)/Zr—O (5–50)

l. glass/Zr—Co(10–100)/PtMn(30–400)/CoFe(10–100)/Cu(15–40)/CoFe(1–40)/NiFe(1–100)/Cu(3–30)/Ta—O (5–50)

6. Ground Layer: a nickel oxide a. glass/Ni—O(10–1000)/NiMn(30–400)/CoFe(10–100)/Cu(15–40)/CoFe(1–40)/NiFe(1–100)/Cu(3–30)/Zr (5–50)

b. glass/Ni—O(10–1000)/NiMn(30–400)/CoFe(10–100)/Cu(15–40)/CoFe(1–40)/NiFe(1–100)/Cu(3–30)/Ta (5–50)

c. glass/Ni—O(10–1000)/NiMn(30–400)/CoFe(10–100)/Cu(15–40)/CoFe(1–40)/NiFe(1–100)/Cu(3–30)/Zr—O (5–50)

d. glass/Ni—O(10–1000)/NiMn(30–400)/CoFe(10–100)/Cu(15–40)/CoFe(1–40)/NiFe(1–100)/Cu(3–30)/Ta—O (5–50)

e. glass/Ni—O(10–1000)/PdMn(30–400)/CoFe(10–100)/Cu(15–40)/CoFe(1–40)/NiFe(1–100)/Cu(3–30)/Zr (5–50)

f. glass/Ni—O(10–1000)/PdMn(30–400)/CoFe(10–100)/Cu(15–40)/CoFe(1–40)/NiFe(1–100)/Cu(3–30)/Ta (5–50)

g. glass/Ni—O(10–1000)/PdMn(30–400)/CoFe(10–100)/Cu(15–40)/CoFe(1–40)/NiFe(1–100)/Cu(3–30)/Zr—O (5–50)

h. glass/Ni—O(10–1000)/PdMn(30–400)/CoFe(10–100)/Cu(15–40)/CoFe(1–40)/NiFe(1–100)/Cu(3–30)/Ta—O (5–50)

i. glass/Ni—O(10–1000)/PtMn(30–400)/CoFe(10–100)/Cu(15–40)/CoFe(1–40)/NiFe(1–100)/Cu(3–30)/Zr (5–50)

j. glass/Ni—O(10–1000)/PtMn(30–400)/CoFe(10–100)/Cu(15–40)/CoFe(1–40)/NiFe(1–100)/Cu(3–30)/Ta (5–50)

k. glass/Ni—O(10–1000)/PtMn(30–400)/CoFe(10–100)/Cu(15–40)/CoFe(1–40)/NiFe(1–100)/Cu(3–30)/Zr—O (5–50)

l. glass/Ni—O(10–1000)/PtMn(30–400)/CoFe(10–100)/Cu(15–40)/CoFe(1–40)/NiFe(1–100)/Cu(3–30)/Ta—O (5–50)

7. Ground Layer: a cobalt oxide a. glass/Co—O(10–1000)/NiMn(30–400)/CoFe(10–100)/Cu(15–40)/CoFe(1–40)/NiFe(1–100)/Cu(3–30)/Zr (5–50)

b. glass/Co—O(10–1000)/NiMn(30–400)/CoFe(10–100)/Cu(15–40)/CoFe(1–40)/NiFe(1–100)/Cu(3–30)/Ta(5–50)

c. glass/Co—O(10–1000)/NiMn(30–400)/CoFe(10–100)/Cu(15–40)/CoFe(1–40)/NiFe(1–100)/Cu(3–30)/Zr—O (5–50)

d. glass/Co—O(10–1000)/NiMn(30–400)/CoFe(10–100)/Cu(15–40)/CoFe(1–40)/NiFe(1–100)/Cu(3–30)/Ta—O(5–50)

e. glass/Co—O(10–1000)/PdMn(30–400)/CoFe(10–100)/Cu(15–40)/CoFe(1–40)/NiFe(1–100)/Cu(3–30)/Zr(5–50)

f. glass/Co—O(10–1000)/PdMn(30–400)/CoFe(10–100)/Cu(15–40)/CoFe(1–40)/NiFe(1–100)/Cu(3–30)/Ta (5–50)

g. glass/Co—O(10–1000)/PdMn(30–400)/CoFe(10–100)/Cu(15–40)/CoFe(1–40)/NiFe(1–100)/Cu(3–30)/Zr—O(5–50)

h. glass/Co—O(10–1000)/PdMn(30–400)/CoFe(10–100)/Cu(15–40)/CoFe(1–40)/NiFe(1–100)/Cu(3–30)/Ta—O(5–50)

i. glass/Co—O(10–1000)/PtMn(30–400)/CoFe(10–100)/Cu(15–40)/CoFe(1–40)/NiFe(1–100)/Cu(3–30)/Zr (5–50)

j. glass/Co—O(10–1000)/PtMn(30–400)/CoFe(10–100)/Cu(15–40)/CoFe(1–40)/NiFe(1–100)/Cu(3–30)/Ta (5–50)

k. glass/Co—O(10–1000)/PtMn(30–400)/CoFe(10–100)/Cu(15–40)/CoFe(1–40)/NiFe(1–100)/Cu(3–30)/Zr—O (5–50)

l. glass/Co—O(10–1000)/PtMn(30–400)/CoFe(10–100)/Cu(15–40)/CoFe(1–40)/NiFe(1–100)/Cu(3–30)/Ta—O (5–50)

8. Ground Layer: an iron oxide a. glass/Fe—O(10–1000)/NiMn(30–400)/CoFe(10–100)/Cu(15–40)/CoFe(1–40)/NiFe(1–100)/Cu(3–30)/Zr (5–50)

b. glass/Fe—O(10–1000)/NiMn(30–400)/CoFe(10–100)/Cu(15–40)/CoFe(1–40)/NiFe(1–100)/Cu(3–30)/Ta (5–50)

c. glass/Fe—O(10–1000)/NiMn(30–400)/CoFe(10–100)/Cu(15–40)/CoFe(1–40)/NiFe(1–100)/Cu(3–30)/Zr—O (5–50)

d. glass/Fe—O(10–1000)/NiMn(30–400)/CoFe(10–100)/Cu(15–40)/CoFe(1–40)/NiFe(1–100)/Cu(3–30)/Ta—O (5–50)

e. glass/Fe—O(10–1000)/PdMn(30–400)/CoFe(10–100)/Cu(15–40)/CoFe(1–40)/NiFe(1–100)/Cu(3–30)/Zr (5–50)

f. glass/Fe—O(10–1000)/PdMn(30–400)/CoFe(10–100)/Cu(15–40)/CoFe(1–40)/NiFe(1–100)/Cu(3–30)/Ta (5–50)

g. glass/Fe—O(10–1000)/PdMn(30–400)/CoFe(10–100)/Cu(15–40)/CoFe(1–40)/NiFe(1–100)/Cu(3–30)/Zr—O (5–50)

h. glass/Fe—O(10–1000)/PdMn(30–400)/CoFe(10–100)/Cu(15–40)/CoFe(1–40)/NiFe(1–100)/Cu(3–30)/a-O (5–50)

i. glass/Fe—O(10–1000)/PtMn(30–400)/CoFe(10–100)/Cu(15–40)/CoFe(1–40)/NiFe(1–100)/Cu(3–30)/Zr (5–50)

j. glass/Fe—O(10–1000)/PtMn(30–400)/CoFe(10–100)/Cu(15–40)/CoFe(1–40)/NiFe(1–100)/Cu(3–30)/Ta (5–50)

k. glass/Fe—O(10–1000)/PtMn(30–400)/CoFe(10–100)/Cu(15–40)/CoFe(1–40)/NiFe(1–100)/Cu(3–30)/Zr—O (5–50)

13 l. glass/Fe—O(10–1000)/PtMn(30–400)/CoFe(10–100)/Cu(15–40)/CoFe(1–40)/NiFe(1–100)/Cu(3–30)/Ta—O(5–50)

9. CoFe/(Ru, Cr, Rh)/CoFe magnetic thin film
   a. glass/Zr(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Zr(5–50)
   b. glass/Zr(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Ta(5–50)
   c. glass/Hf(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Zr(5–50)
   d. glass/Hf(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Ta(5–50)
   e. glass/Zr—Hf(10–100)/PtMn(30–400)/CoFe(10–50)/(Ru, Cr, Rh)(4–10)/ CoFe(10–50)/Cu(15–40)/CoFe(1–40)/NiFe(1–100)/Cu(3–30)/Zr(5–50)
   f. glass/Zr—Hf(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Ta(5–50)
   g. glass/Zr—Au(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Zr(5–50)
   h. glass/Zr—Au(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Ta(5–50)
   i. glass/Zr—Co(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Zr(5–50)
   j. glass/Zr—Co(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Ta(5–50)
   k. glass/Ni—O(10–1000)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Zr(5–50)
   l. glass/Ni—O(10–1000)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Ta(5–50)
   m. glass/Co—O(10–1000)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Zr(5–50)
   n. glass/Co—O(10–1000)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Ta(5–50)
   o. glass/Fe—O(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Zr(5–50)
   p. glass/Fe—O(10–1000)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Ta(5–50)
   q. glass/Zr(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Zr—O(5–50)
   r. glass/Hf(10–100)/PtMn(30–400)/CoFe(10–50)/(Ru, Cr, Rh)(4–10)/CoFe(10–50)/Cu(15–40)/CoFe(1–40)/NiFe(10–100)/Cu(3–30)/Zr—O(5–50)
   s. glass/Zr—Hf(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Zr—O(5–50)
   t. glass/Zr—Au(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Zr—O(5–50)
   u. glass/Zr—Co(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Zr—O(5–50)
   v. glass/Ni—O(10–1000)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Zr—O(5–50)
   w. glass/Co—O(10–1000)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Zr—O(5–50)
   x. glass/Fe—O(10–1000)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Zr—O(5–50)
   y. glass/Zr(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Ta—O(5–50)
   z. glass/Hf(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Ta—O(5–50)
   aa. glass/Zr—Hf(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Ta—O(5–50)
   bb. glass/Zr—Au(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Ta—O(5–50)
   cc. glass/Zr—Co(10–100)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Ta—O(5–50)
   dd. glass/Ni—O(10–1000)/PtMn(30–400)/CoFe(10–50)/(Ru, Cr, Rh)(4–10)/CoFe(10–50)/Cu(15–40)/CoFe(1–40)/NiFe(1–100)/Cu(3–30)/Ta—O(5–50)

Figure 5:
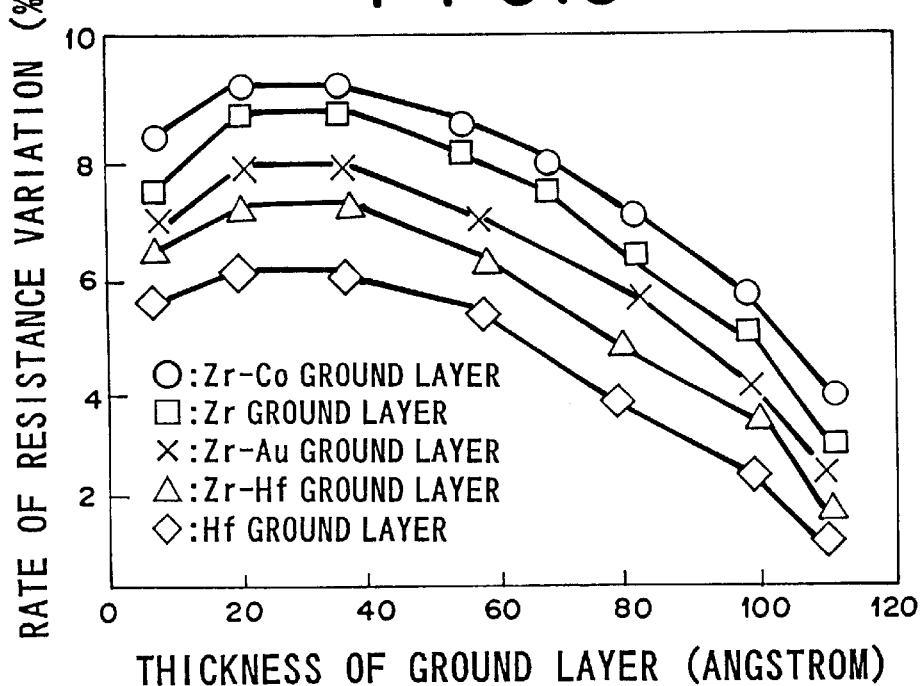
FIG. 5 shows a dependency of a resistance variation rate on a thickness of a ground layer in the MR film of the present invention.

FIG. 5 shows a dependency of the resistance variation rate on the ground layer thickness. The resistance variation rate greatly depends on the ground layer thickness if a metallic ground layer is employed. It comes to the maximum between 20–30 Å and remarkably decreases at more than 100 Å due to the branched current of conduction electrons.

FIG. 6 shows another dependency of the resistance variation rate on the ground layer thickness. The resistance variation rate is not affected greatly by the ground layer thickness if an oxide ground layer is employed. If the thickness exceeds 500 Å, however, the antiferromagnetic thin film laminated on the ground layer has a larger roughness. Accordingly, the planarity of the interface in the multi-layered magnetic film degrades, reducing the magnetic resistance variation rate.

FIG. 7 shows a dependency of the resistance variation rate on an average roughness of the antiferromagnetic thin film. The resistance variation rate is affected by the average roughness of the antiferromagnetic thin film regardless of the ground material employed. The average roughness degrades the planarity of the interface in the multi-layered magnetic film if it exceeds 5 Å, reducing the resistance variation rate.

Figure 8:
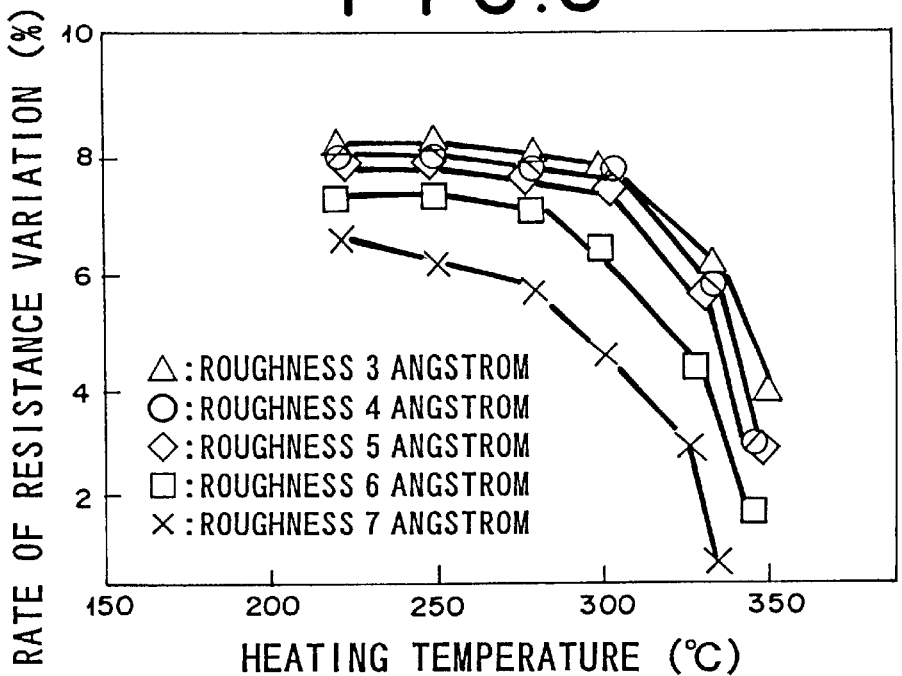
FIG. 8 shows a dependency of the resistance variation rate on a temperature of heating treatment for manufacturing the MR film of the present invention.

FIG. 8 shows a dependency of the resistance variation rate on a heating temperature with respect to samples each having a different average roughness of the antiferromagnetic thin film. The average roughness greatly affects an anti-heating property of the resistance variation rate. An average roughness over 5 Å reduces the resistance variation rate remarkably for a heating process at 250° C. or more.

Figure 9:
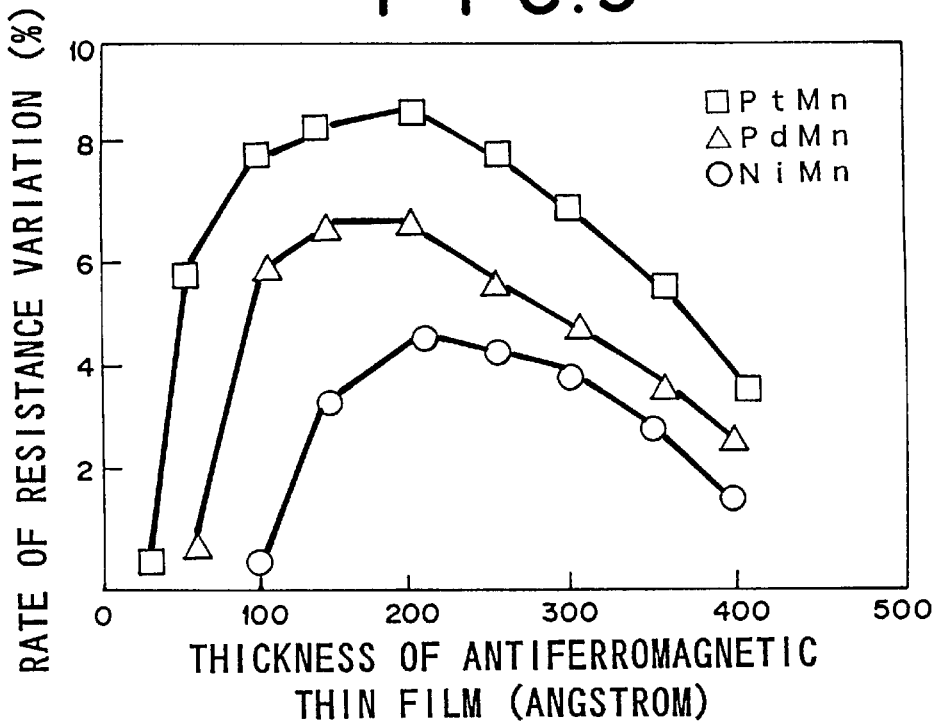
FIG. 9 shows a dependency of a resistance variation rate on a thickness of an antiferromagnetic layer in the MR film of the present invention.

FIG. 9 shows a dependency of the resistance variation rate on the thickness of the antiferromagnetic layer. A thickness below 50 Å causes an insufficient phase transfer into the antiferromagnetic phase by the heating process, reducing the exchange bias field applied to the adjacent magnetic thin film and lowering the resistance variation rate remarkably. A thickness above 350 Å decreases the resistance variation rate due to the branched current of conduction electrons into the antiferromagnetic layer.

FIG. 10 shows a dependency of the resistance variation rate on the thickness of the conduction layer. Interposition of the conduction layer elevates the resistance variation rate and realizes the maximum at near 10 Å thick. A further increased thickness lowers it due to the effect of the branched current of electrons.

FIG. 11 shows a dependency of the resistance variation rate on the thickness of the protection layer laminated adjacent to the conduction layer. A thickness below 5 Å lowers the resistance variation rate due to the oxidization of the conduction layer and the magnetic thin film adjacent beneath thereto. The use of a metallic protection layer consisting of Ta or Zr with a thickness of 50 Å or more reduces the resistance variation rate due to the effect of the branched current of conduction electrons.

Figure 12:
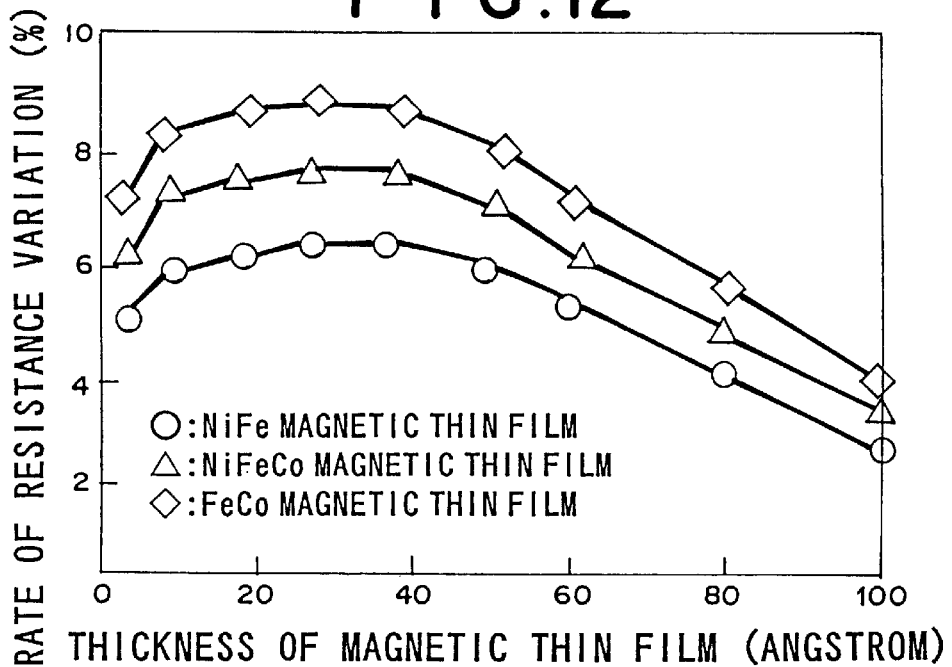
FIG. 12 shows a dependency of the resistance variation rate on a thickness of a magnetic layer in the MR film of the present invention.

FIG. 12 shows a dependency of the resistance variation rate on the thickness of the magnetic layer. The resistance variation rate depends on the thickness of the magnetic layer. A thickness over 80 Å reduces the electron scattering ability, lowering the resistance variation rate. A thickness below 3 Å hardly retains a uniform thickness, lowering the resistance variation rate remarkably.

Figure 13:
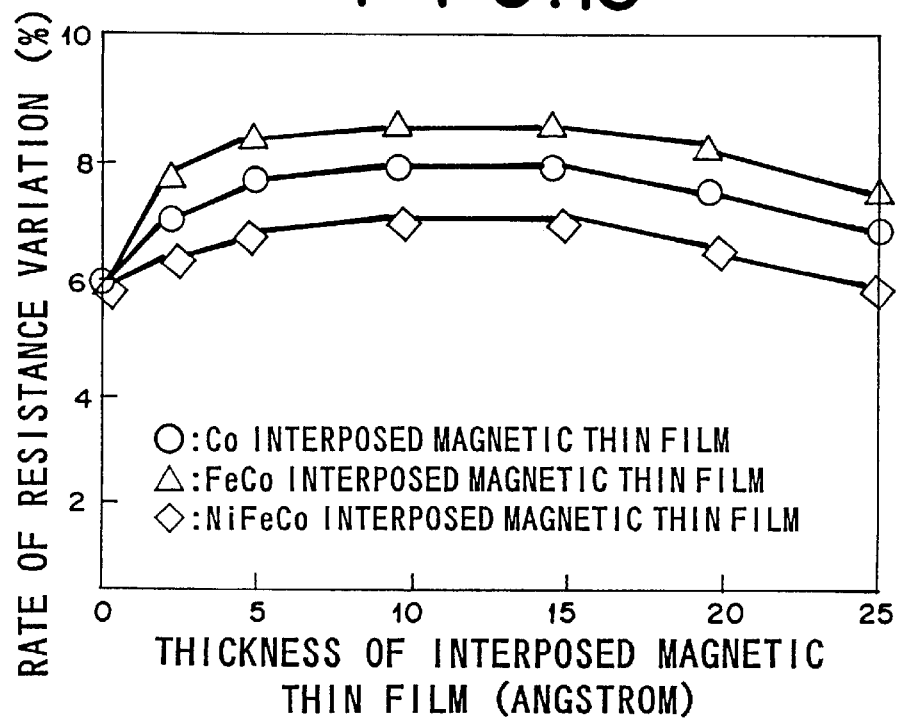
FIG. 13 shows a dependency of the resistance variation rate on a thickness of an interposed magnetic layer in the MR film of the present invention.

FIG. 13 shows a dependency of the resistance variation rate on the thickness of the interposed magnetic layer consisting of Co, FeCo or NiFeCo. Interposition of the Co system magnetic layer elevates the resistance variation rate and saturates it at near 5–10 Å thick.

Figure 14:
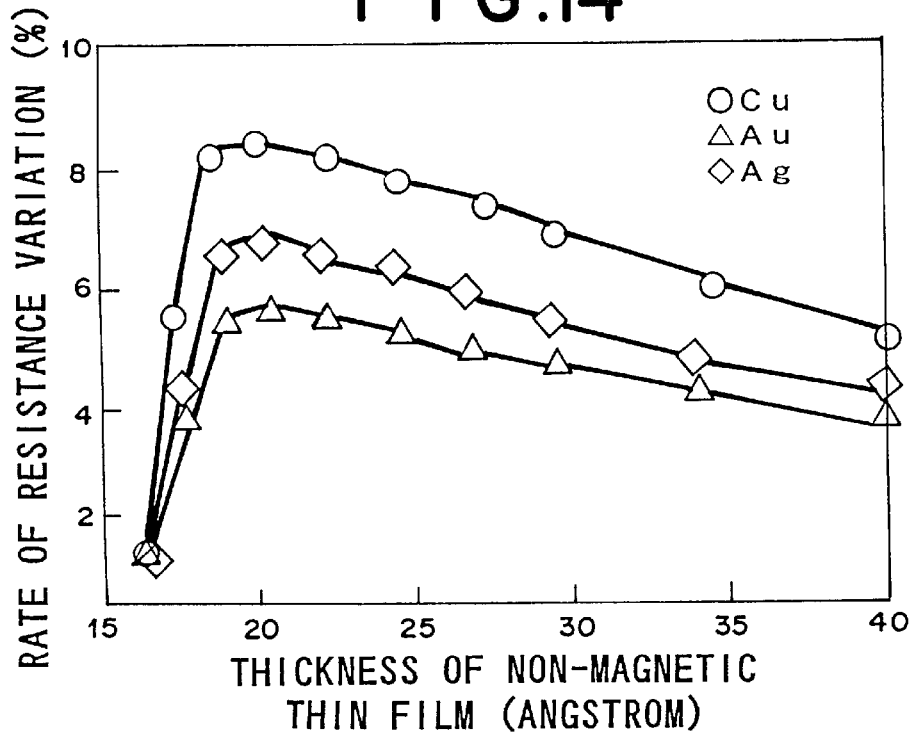
FIG. 14 shows a dependency of the resistance variation rate on a thickness of a non-magnetic layer in the MR film of the present invention.

FIG. 14 shows a dependency of the resistance variation rate on the thickness of the non-magnetic layer. The resistance variation rate greatly depends on the thickness of the non-magnetic layer. It comes to the maximum at near 20–25 Å thick. A thickness below 20 Å lowers the resistance variation rate remarkably due to the magnetic contact between the adjacent magnetic layers via the non-magnetic layer. A thickness above 35 Å increases a ratio of conduction electrons flowing through the non-magnetic layer and decreases the resistance variation rate.

Figure 15:
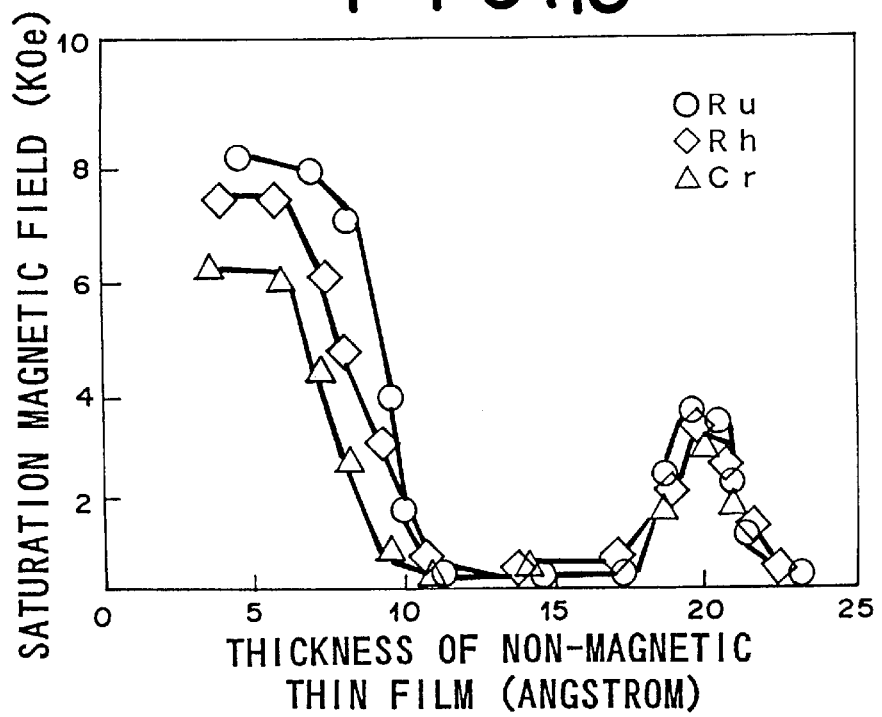
FIG. 15 shows a dependency of a saturated magnetic field on a thickness of a non-magnetic layer in an antiferromagnetically coupled three-layered film in the MR film of the present invention.

FIG. 15 shows a dependency of the saturation magnetic field on a thickness of the non-magnetic layer in the antiferromagnetically-coupled thin film. The non-magnetic materials of Ru, Rh and Cr each can achieve an extremely large saturation magnetic field, especially at 4–10 Å thick.

Figure 16:
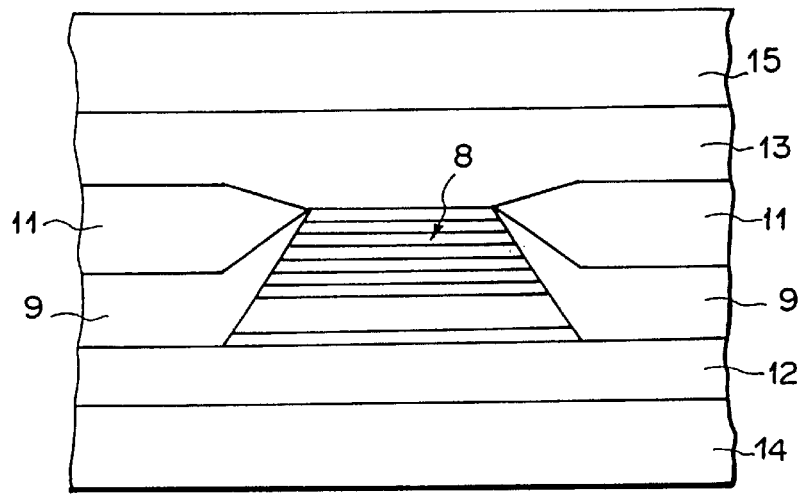
FIG. 16 is a side view showing part of a shield type MR device of the present invention.

FIG. 16 is a cross sectional view showing part of a shield type MR device of the present invention. This MR device includes an MR film laminated between the upper and lower shields via insulators and patterned. A permanent magnetic film is disposed adjacent to the MR film to convert the magnetic layer for sensing the magnetic field into single magnetic domain.

Figure 17A:
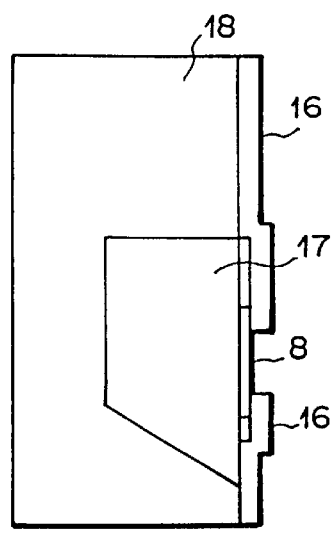
FIGS. 17A and 17B are side and front views showing part of a yoke type MR device of the present invention.
Figure 17B:
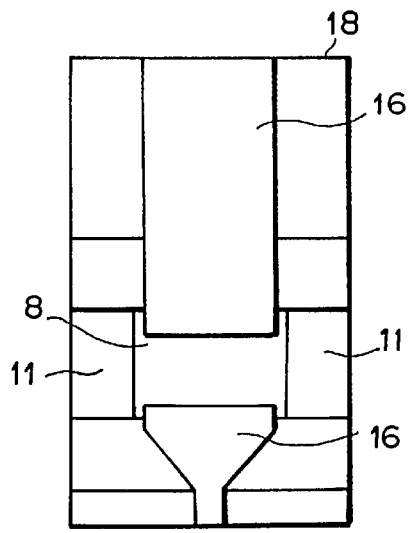

FIGS. 17A and 17B are a side and front views showing part of a yoke type MR device of the present invention. This MR device includes an MR film laminated on a ferrite substrate and patterned. The permanent magnetic film is disposed adjacent to the MR film similarly to the shield type MR device to convert the magnetic layer for sensing the magnetic field into single magnetic domain. An external magnetic flux is introduced through a yoke.

Figure 18:
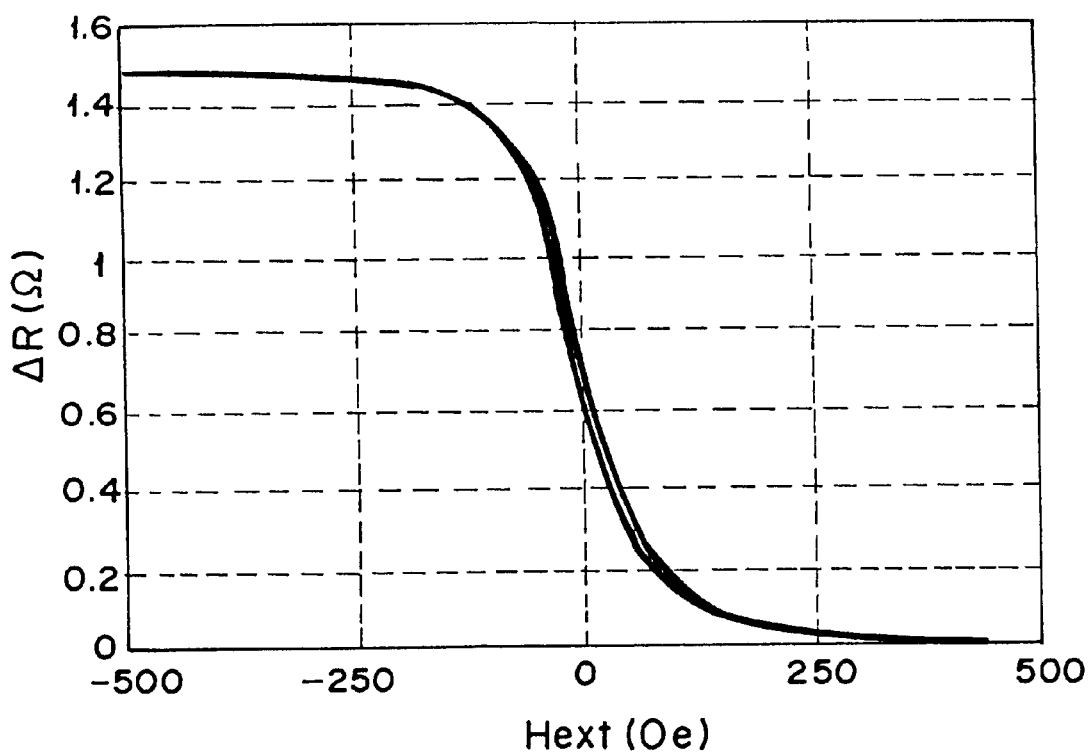
FIG. 18 shows MR curves of the MR device of the present invention.

FIG. 18 shows an MR curve of the MR device of the present invention having a height of 0.8 μm and width of 0.8 μm in which a spin valve film is arranged adjacent to a permanent magnetic film of CoCrPt for stabilizing magnetic domain. The permanent magnetic film improves stability for magnetic domain and prevents a non-linear output such as Barkhausen jump, achieving an output 6–10 times the conventional MR film.

The MR device of the present invention is microfabricated to have a height of 0.1–1.0 μm, width of 0.1–1.0 μm and sense current density of $5 \times 10^6$–$2 \times 10^8$ A/cm$^2$. Preferably, the width is designed in accordance with a magnetic recording/reproducing density and the height is made preferably less than the width to increase a reproducing sensitivity. The current density corresponds to an output from a magnetic head and is preferably $2 \times 10^8$ A/cm$^2$ or less so as not to degrade the characteristic of the device heated by an excessive current density. A current density less than $5 \times 10^6$ A/cm$^2$ lowers the output extremely and is not preferable in view of S/N of the magnetic recording/reproducing system while the heat generation at the device can be ignored.

As obvious from the forgoing, the present invention can provide an MR film and device capable of exhibiting a large resistance variation linearly at near zero magnetic field with an excellent thermal stability.

Having described the embodiments consistent with the present invention, other embodiments and variations consistent with the present invention will be apparent to those skilled in the art. Therefore, the invention should not be viewed as limited to the disclosed embodiments but rather should be viewed as limited only by the spirit and scope of the appended claims.

What is claimed is:

1. A magnetoresistance effect film formed on a substrate, comprising:

a plurality of magnetic thin films;

a non-magnetic thin film interposed between said magnetic thin films arranged adjacent thereto; and an antiferromagnetic thin film arranged adjacent to one of a pair of said magnetic thin films disposed via the non-magnetic thin film, said antiferromagnetic thin film generating an exchange bias field of $H_r$, the other of said pair of magnetic thin films having a coercive force of $H_{c2}$ lower than $H_r$, wherein said magnetoresistance effect film comprises a ground layer formed on said substrate, said ground layer being made of material selected from the group consisting of Zr—Hf, Zr—Au and Zr—Co, said antiferromagnetic thin film being laminated adjacent to and in contact with said ground layer, and said antiferromagnetic thin film comprises PtMn or PdMn, said antiferromagnetic thin film having a surface with an average roughness of 1–5 Å.

2. The magnetoresistance effect film according to claim 1, further comprising:

a conduction layer made of material selected from the group consisting of Cu, Ag, Au and an alloy composed of at least two selected therefrom and formed adjacent to said other of the pair of magnetic thin films which senses a magnetic field; and a layer of Zr or Ta laminated adjacent to said conduction layer.

3. The magnetoresistance effect film according to claim 2, wherein said conduction layer has a thickness of 3–30 Å.

4. The magnetoresistance effect film according to claim 2, wherein said layer of Zr or Ta laminated adjacent to said conduction layer has a thickness of 5–50 Å.

5. The magnetoresistance effect film according to claim 1, further comprising:

a conduction layer made of material selected from the group consisting of Cu, Ag, Au and an alloy composed of at least two selected therefrom and formed adjacent to said other of the pair of magnetic thin films which senses a magnetic field; and a layer of zirconium oxide or tantalum oxide laminated adjacent to said conduction layer.

6. The magnetoresistance effect film according to claim 5, wherein said conduction layer has a thickness of 3–30 Å.

7. The magnetoresistance effect film according to claim 5, wherein said layer of zirconium oxide or tantalum oxide laminated adjacent to said conduction layer has a thickness of 5–50 Å.

8. The magnetoresistance effect film according to claim 1, further comprising:

a conduction layer made of material selected from the group consisting of Cu, Ag, Au and an alloy composed of at least two selected therefrom and formed adjacent to said other of the pair of magnetic thin films which senses a magnetic field; and a layer of a mixture of zirconium and zirconium oxide or a mixture of tantalum and tantalum oxide laminated adjacent to said conduction layer.

9. The magnetoresistance effect film according to claim 8, wherein said conduction layer has a thickness of 3–30 Å.

10. The magnetoresistance effect film according to claim 8, wherein said layer of mixture of zirconium and zirconium oxide or said mixture of tantalum and tantalum oxide laminated adjacent to said conduction layer has a thickness of 5–50 Å.

11. The magnetoresistance effect film according to claim 1, wherein said ground layer has a thickness of 10–100 Å.

12. The magnetoresistance effect film according to claim 1, wherein said ground layer has a thickness of 10–500 Å.

13. The magnetoresistance effect film according to claim 1, wherein said antiferromagnetic thin film has a thickness of 50–350 Å.

14. The magnetoresistance effect film according to claim 1, wherein said magnetic thin film adjacent to said antiferromagnetic thin film is an antiferromagnetically coupled three-layered film consisting of magnetic/non-magnetic/magnetic layers.

15. The magnetoresistance effect film according to claim 14, wherein said non-magnetic layer in said three-layered film is made of Ru, Cr, Rh or an alloy composed of at least two selected therefrom.

16. The magnetoresistance effect film according to claim 14, wherein said non-magnetic layer in said three-layered film has a thickness of 4–10 Å.

17. The magnetoresistance effect film according to claim 14, wherein said magnetic layer in said three-layered film is made of Co, FeCo, NiFe or NiFeCo.

18. The magnetoresistance effect film according to claim 1, wherein said non-magnetic thin film is made of Cu, Au, Ag, Ru, Al or an alloy composed of at least two selected therefrom.

19. The magnetoresistance effect film according to claim 1, wherein said non-magnetic thin film has a thickness of 20–35 Å.

20. The magnetoresistance effect film according to claim 1, wherein said magnetic thin films are made of material mainly composed of a metal or alloy selected from the group consisting of Ni, Fe, Co, FeCo, NiFe and NiFeCo.

21. The magnetoresistance effect film according to claim 1, wherein said magnetic thin films have a thickness of 3–80 Å.

22. The magnetoresistance effect film according to claim 1, further comprising a layer of Co, FeCo or NiFeCo with a thickness of 1–20 Å interposed into an interface between said non-magnetic and magnetic thin films.

23. A method of manufacturing the magnetoresistance effect film of claim 1, comprising rotating a direction of magnetic field applied during film formation by 90 degrees relative to the substrate such that the easy magnetization axes of resulting adjacent magnetic thin films via the non-magnetic thin film cross to each other at right angle.

24. A magnetoresistance effect device comprising the magnetoresistance effect film of claim 1, said device having a height of 0.1–1.0 μm, width of 0.1–1.0 μm and sense current density of $5 \times 10^6 - 2 \times 10^8$ A/cm².

25. The magnetoresistance effect device according to claim 24, wherein the magnetic thin film not adjacent to said antiferromagnetic thin film is converted into a single magnetic domain in a sufficient bias field.

26. The magnetoresistance effect device according to claim 25, further comprising a means for generating said bias field including a permanent magnetic film disposed adjacent to said magnetic thin film.

27. The magnetoresistance effect device according to claim 25, further comprising a means for generating said bias field including an antiferromagnetic film disposed adjacent to said magnetic thin film.

28. A magnetoresistance effect sensor comprising the magnetoresistance effect device of claim 24 and a pair of layers made of magnetically soft material with a high permeability for sandwiching the magnetoresistance effect device therebetween via insulation layers.

29. A magnetoresistance effect sensor comprising the magnetoresistance effect device of claim 24 and a yoke made of magnetically soft material with a high permeability for introducing a magnetic signal field into the magnetoresistance effect device.

30. A system for sensing a magnetic resistance, comprising the magnetoresistance effect device of claim 24 and a means for sensing a resistance variation rate of said magnetoresistance effect device as a function of a magnetic field to be sensed.

* * * * *